(12) United States Patent
Kim et al.

(10) Patent No.: US 9,049,781 B2
(45) Date of Patent: Jun. 2, 2015

(54) DISPLAY APPARATUS

(71) Applicants: Youngmin Kim, Seoul (KR); Sangdon Park, Seoul (KR)

(72) Inventors: Youngmin Kim, Seoul (KR); Sangdon Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 171 days.

(21) Appl. No.: 13/709,338

(22) Filed: Dec. 10, 2012

(65) Prior Publication Data

US 2013/0155585 A1    Jun. 20, 2013

(30) Foreign Application Priority Data

Dec. 19, 2011  (KR) .................. 10-2011-0137750

(51) Int. Cl.
*G06F 1/16* (2006.01)
*H05K 5/02* (2006.01)

(52) U.S. Cl.
CPC ............ *H05K 5/0217* (2013.01); *H05K 5/0221* (2013.01)

(58) Field of Classification Search
CPC ....................................................... G06F 1/16
USPC ........ 348/836, 725, 794, 739; 349/62, 15, 58, 349/96, 65, 60, 63, 98, 187, 12; 248/231.91, 611, 550; 361/679.01, 361/679.26, 679.03, 679.27, 679.21, 361/679.22, 679.54, 679.09, 679.08, 361/679.41, 679.55; 362/97.1, 97.2, 621, 362/19, 633, 613, 617, 627, 362, 225, 611, 362/612, 373; 257/40, 99; 345/207, 173, 345/107, 206, 60, 156, 905
See application file for complete search history.

(56) References Cited

U.S. PATENT DOCUMENTS

| 2010/0147582 | A1 | 6/2010 | Shin et al. ...................... 174/535 |
| 2011/0261282 | A1 | 10/2011 | Jean et al. ......................... 348/58 |
| 2013/0258246 | A1* | 10/2013 | Kim et al. ......................... 349/62 |
| 2014/0152906 | A1* | 6/2014 | Yokawa et al. ............... 348/836 |

FOREIGN PATENT DOCUMENTS

KR   10-2006-0084558 A   7/2006

OTHER PUBLICATIONS

European Search Report dated Apr. 15, 2013 issued in Application No. 12 00 8267.

* cited by examiner

*Primary Examiner* — Hung Duong
(74) *Attorney, Agent, or Firm* — Ked & Associates, LLP

(57) ABSTRACT

Provided is a display apparatus. The display apparatus includes a display panel, a guide member supporting a peripheral area of a back surface of the display panel, an adhesion member fixing the guide member to the display panel, and a bottom cover supporting a lower portion of the guide member.

19 Claims, 7 Drawing Sheets

DISPLAY APPARATUS

CROSS-REFERENCE TO RELATED APPLICATIONS

The present application claims priority under 35 U.S.C. 119 and 35 U.S.C. 365 to Korean Patent Application No. 10-2011-0137750 (filed on Dec. 19, 2011), which is hereby incorporated by reference in its entirety.

BACKGROUND

The present disclosure relates to a display apparatus.

As an information-oriented society develops, needs for diverse forms of display apparatuses are increasing. Accordingly, research has been carried out on various display apparatuses such as liquid crystal display devices (LCDs), plasma display panels (PDPs), electro luminescent displays (ELDs), vacuum fluorescent displays (VFDs), and the like, which have been commercialized.

Among these, a liquid crystal panel of a liquid crystal display (LCD) includes a liquid crystal layer, TFT substrates facing each other with the liquid crystal layer therebetween, and a color filter substrate. The liquid crystal panel may use light supplied from a backlight unit to display an image because it does not emit light.

SUMMARY

Embodiments provide a display apparatus having an improved structure.

In one embodiment, the display apparatus includes: a display panel; a guide member supporting a peripheral area of a back surface of the display panel; an adhesion member fixing the guide member to the display panel; and a bottom cover supporting a lower portion of the guide member.

The details of one or more embodiments are set forth in the accompanying drawings and the description below. Other features will be apparent from the description and drawings, and from the claims.

DETAILED DESCRIPTION OF THE EMBODIMENTS

Figure 1:
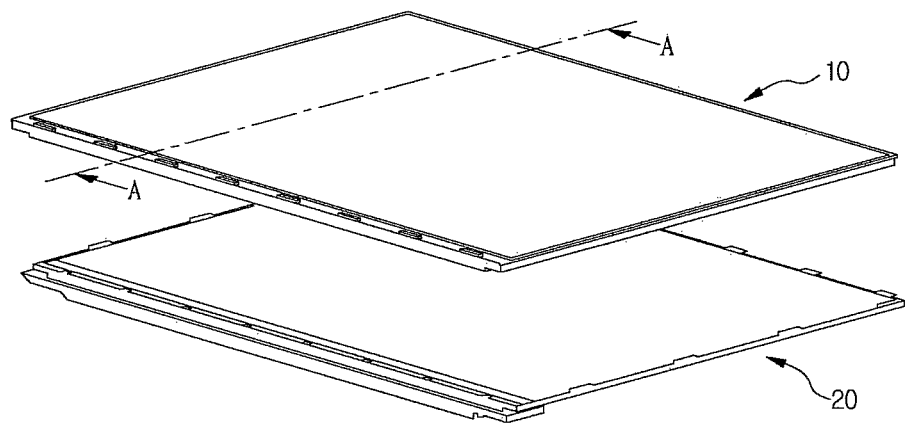
FIG. 1 is a perspective view of a display apparatus according to an embodiment.

Exemplary embodiments of the present disclosure will now be described with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

In description of a display apparatus according to an embodiment, a front direction represents a panel assembly 10 side, and a rear direction represents a backlight unit assembly 20 side in FIG. 1.

Thus, it should be understood that a front side represents an upper side, and a rear side represents a lower side.

FIG. 1 is a perspective view of a display apparatus according to an embodiment. The display apparatus may include a display panel assembly 10 and a backlight unit assembly 20.

Referring to FIG. 1, the display panel assembly 10 is disposed on a front side of the display apparatus. The display panel assembly 10 may include a display panel and a plurality of frames which support the display panel and define outer appearances of front and side surfaces of the display apparatus.

Figure 2:
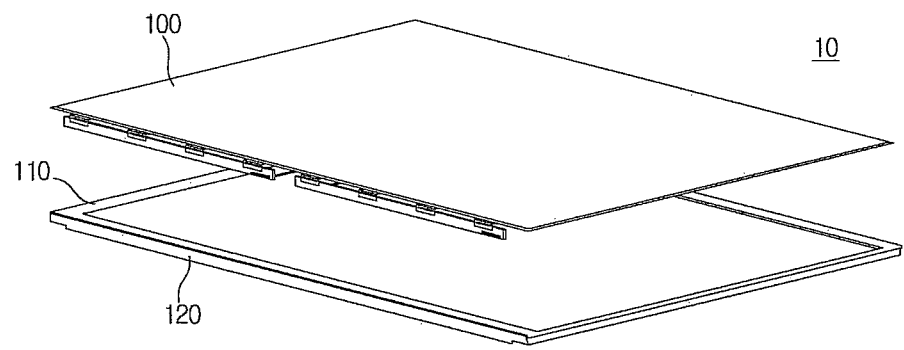
FIG. 2 is a perspective view of a display panel assembly provided in the display apparatus of FIG. 1 according to an embodiment.

Particularly, as shown in FIG. 2, the display panel assembly 10 may include a display panel 10, a guide member 110, and a top case 120.

The display panel 100 may include front and rear substrates facing each other and attached to each other to maintain a uniform gap therebetween. A liquid crystal layer may be disposed between the front substrate and the rear substrate.

Also, a color filter for realizing R, G, and B colors is disposed on a front substrate. The color filer includes a plurality of pixels constituted by a red (R) sub-pixel, a green (G) sub-pixel, and a blue (B) sub-pixel. When light is applied to the color filter, the color filter may generate an image corresponding to each of the R, G, and B colors.

A predetermined transistor for turning on/off a liquid crystal for each pixel, e.g., a thin film transistor (TFT) may be disposed on the rear substrate. Thus, the front substrate may be called a color filter substrate, and the rear substrate may be called a TFT substrate.

Also, a front polarizer film for polarizing light passing through the display panel 100 may be disposed on a front surface of the front substrate. A rear polarizer film for polarizing light emitted from the backlight unit 200 may be disposed on a back surface of the rear substrate.

At least one portion of the guide member 110 may contact a peripheral area of a back surface of the display panel 100 to support the display panel 110. Thus, the guide member 110 may be called a panel guide. Also, to reinforce strength of the guide member 110, a top case 120 may be disposed to contact an outer surface of the guide member 110.

The backlight unit assembly 20 may be disposed on a rear side of the display apparatus. The backlight unit assembly 20 may include a backlight unit and a plurality of frames which support the backlight unit and define an outer appearance of a rear surface of the display apparatus.

The backlight unit 200 may include at least one light source. For example, the light source may be one of a light emitting diode (LED) chip or a light emitting diode package including at least one LED chip. In this case, the light source may include a color LED emitting light having at least one color of red, blue, and green colors or a white LED.

Also, an optical layer (not shown) may be disposed between the display panel 100 and the backlight unit 200. The optical layer may be constituted by a plurality of sheets including a prism sheet and a diffusion sheet.

A bottom cover 210 may be disposed on a rear side of the backlight unit 200. The bottom cover 210 may be disposed on a lower portion of the guide member 110 to support the guide member 110.

Also, another frame, e.g., a back cover (not shown) may be further disposed on a rear side of the bottom cover 210. The back cover may protect the backlight unit against an impact and pressure applied from the outside.

According to an embodiment, an adhesion member for fixing the guide member 110 to the display panel 100 may be disposed on a non-contact area of the guide member 110 which does not contact the display panel 100. Thus, the display panel 100 and the guide member 110 may be shaken together with each other as one assembly.

Thus, light leakage of the display apparatus and introduction of foreign substances may be reduced. Also, stress may be uniformly distributed on each of adhesion surfaces to minimize deformation of the display panel 100. In addition, a process for manufacturing the display panel may be simplified.

Figure 3:
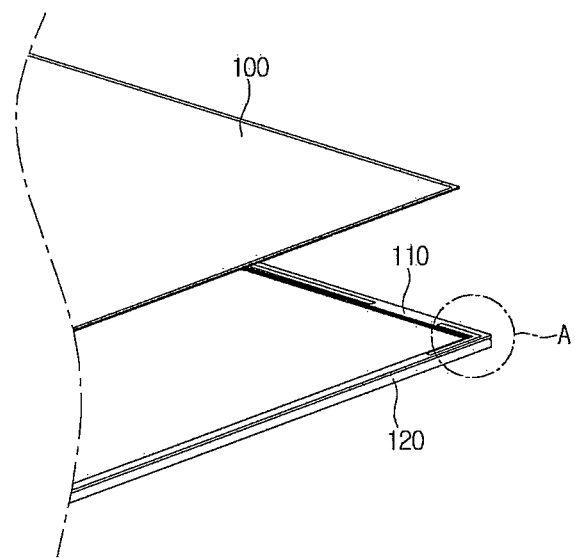
FIG. 3 is a partial enlarged perspective view of the display panel assembly of FIG. 2.
Figure 4:
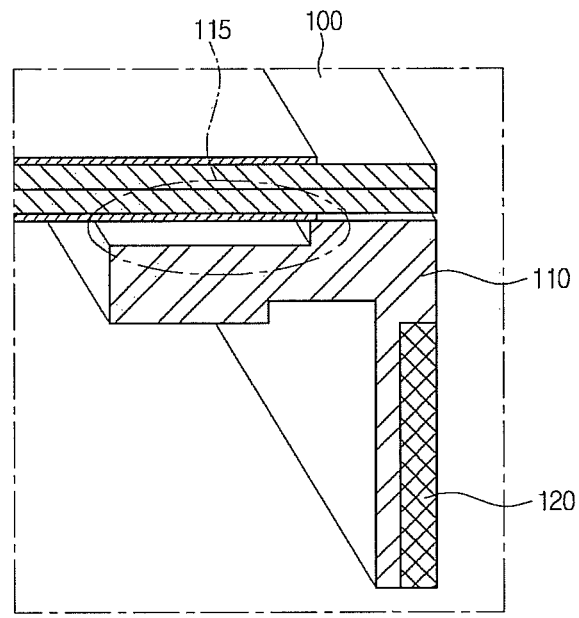
FIGS. 4 to 9 are cross-sectional views of a display apparatus according to embodiments.
Figure 5:
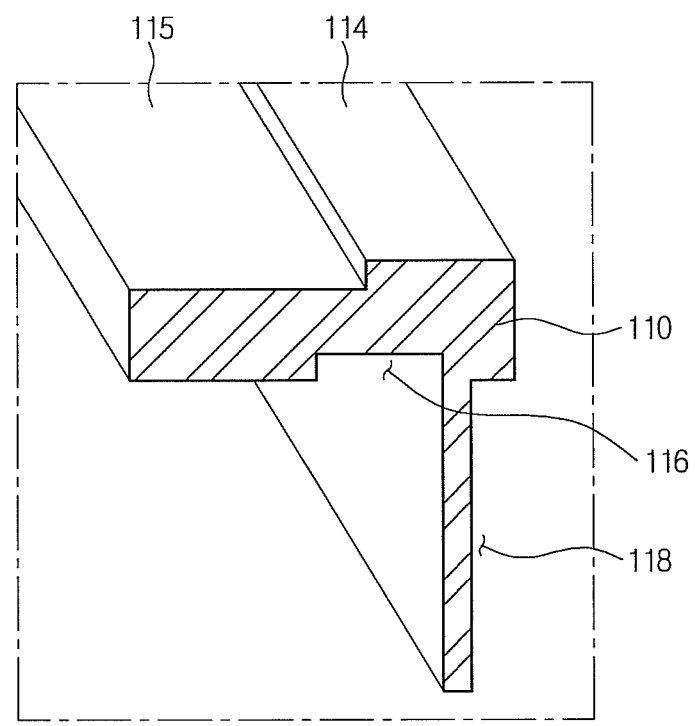

FIG. 3 is a partial enlarged perspective view of the display panel assembly. FIG. 4 is a cross-sectional view taken along line A-A of the display panel assembly of FIG. 1. FIG. 5 is a view of only the guide member 110 of FIG. 4.

Referring to FIGS. 3 to 5, the guide member 110 includes a contact part 114 contacting the back surface of the display panel 100 and a non-contact part 115 which does not contact the back surface of the display panel 100. The guide member 110 may have a stepped top surface. Here, a portion relatively protruding upward may be the contact part 114, and a relatively recessed portion may be the non-contact part 115.

The adhesion member may be provided on the non-contact part 115 of the top surface of the guide member 110, which does not contact the display panel 100 so that the guide member 110 is fixed in a state where the guide member 110 is attached to the display panel 100.

For example, after an adhesive is applied on the non-contact part 115 of the guide member 110, the guide member 110 may be attached to the back surface of the display panel 100 to constitute the display panel assembly 10.

As described above, to prevent foreign substances such as dust from being introduced into the display apparatus, the contact part 114 of the guide member 110 may be disposed outside the non-contact part 115.

As shown in FIGS. 4 and 5, the guide member 110 may be bent in an 'L' shape. Thus, the guide member 110 may include a top surface part fixed to the display panel 100 or supporting the display panel 100 and a side surface part bent downward from the top surface part.

Also, a top case 120 may be disposed to contact an outer surface of the side surface part of the guide member 110 to reinforce strength of the guide member 110. For this, a case coupling part 118 for locating the top case 120 may be coupled to the outer surface of the guide member 110. The top case coupling part 118 may be provided on the stepped area of the outer surface of the guide member 110. In more detail, a portion of the outer surface of the guide member 110 is recessed inward in a stepped shape to define the top case coupling part 118.

Hereinafter, configurations of the display apparatus according to embodiments will be described in more detail with reference to FIGS. 6 to 9.

Figure 6:
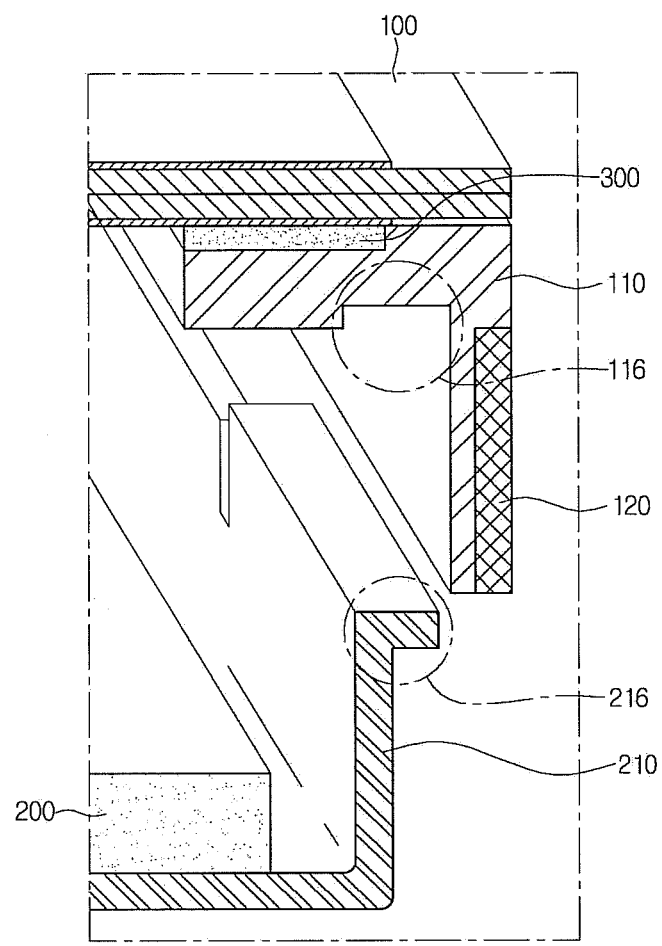

Referring to FIG. 6, the display panel 100 may be attached to the guide member 110 by an adhesion member 300 disposed on the non-contact part 115 of the top surface of the guide member 110. Thus, the display panel 100 together with the guide member 110 and the top case 120 may constitute the display panel assembly 10.

A groove 116 on which an upper end of the bottom cover 210 is seated may be defined in a bottom surface of the guide member 110.

Figure 7:
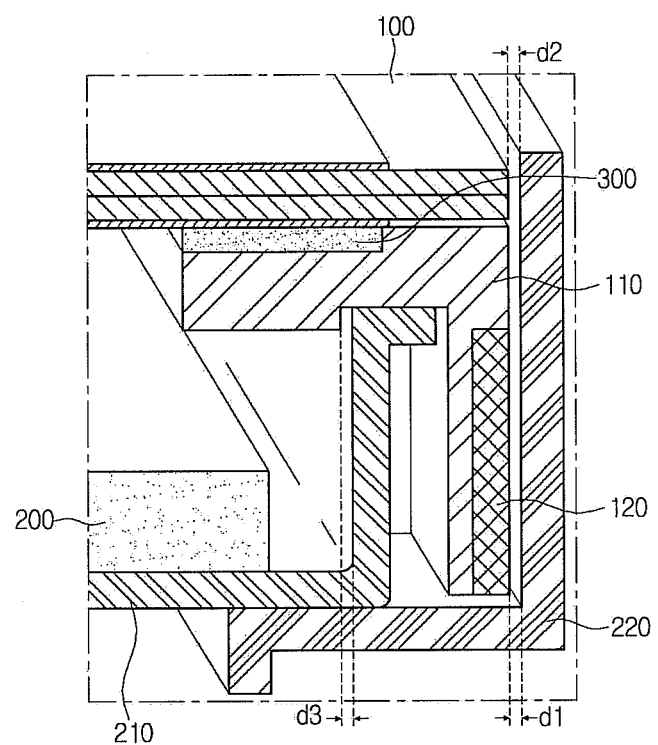

Referring to FIG. 7, since the upper end of the bottom cover 210 is seated on the groove 116 defined in the bottom surface of the guide member 110, the bottom cover 210 may support the guide member 110, more particularly, the display panel assembly 10 including the guide member 110.

The upper end of the bottom cover 210 may have a shape bent in one direction by a predetermined width along the groove 116 defined in the bottom surface of the guide member 110 to prevent the display panel assembly 10 including the display panel 100, the guide member 110, and the top case 120 from being largely shaken in left and right directions.

Referring to FIGS. 6 and 7, the display panel assembly 10 may be shaken within a preset tolerance in a left/right or front/rear direction. For this, the groove 116 defined in the bottom surface of the guide member 110 may have a width greater than that of an upper end 216 of the bottom cover 210. Thus, an end of the upper end 216 of the bottom cover 210 may be spaced a predetermined distance d3 from an end of the groove 116 of the guide member 110.

A middle frame 220 defining an outer appearance of a side surface of the display apparatus may be provided in the display apparatus according to an embodiment. The middle frame 220 may be disposed to laterally cover the display panel 100, the guide member 110, and the top case 120.

The middle frame 220 may be bent in an 'L' shape to cover lower sides of the guide member 110, the top case 120, and a portion of the bottom cover 210.

To prevent the end of the display panel 100 from being damaged due to collision with the middle frame 220 when the display panel assembly 10 is shaken, each of the display panel 100, the guide member 120, and the top case 120 may be spaced a predetermined distance from the middle frame 220.

For example, a position at which the guide member 110 is fixed to the back surface of the display panel 100 using the adhesion member 300 may be a position at which the end of the side surface of the guide member 110 further protrudes outward by a predetermined distance than the end of the display panel 100. Thus, a distance d2 between the display panel 100 and the middle frame 220 may be greater than that d1 between the guide member 110 and the middle frame 220.

Thus, even though the guide member 110 or the top case 120 contacts the middle frame 220, the end of the display panel 100 does not collide with the middle frame 220.

Also, a distance d3 between the end of the bottom cover 210 and the end of the groove 116 defined in the bottom surface of the guide member 110 may be similar to that d1 between the guide member 110 and the middle frame 220. Thus, it may prevent the display panel assembly 10 from being shaken by a degree in which the guide member 110 collides with the middle frame 220.

As described above, the distances d1, d2, and d3 for shake of the display panel assembly 10 may be relatively adjusted to prevent cracks from occurring in the end of the display panel 100 due to the collision. Thus, a coating layer disposed on the end of the display panel 100 to prevent the cracks from occurring may be omitted.

Figure 8:
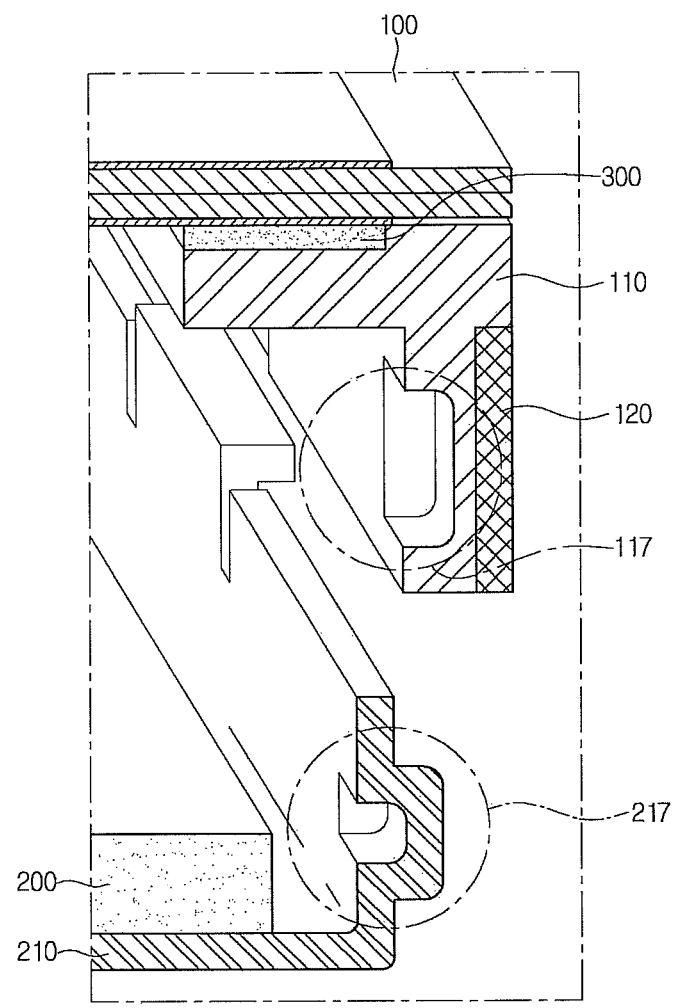

Referring to FIG. 8, a protrusion 217 protruding laterally is disposed on the bottom cover 210. The protrusion 217 disposed on the bottom cover 210 may be inserted into and coupled to the groove 117 defined in an inner surface of the guide member 110. Thus, the display panel assembly 10 and the backlight unit assembly 20 may be fixed to each other without a separate coupling unit such as a screw.

Figure 9:
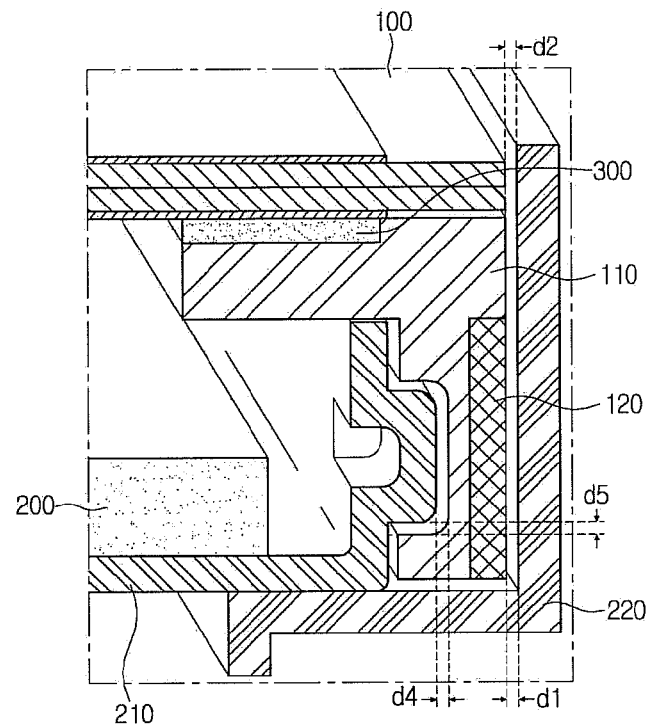

Referring to FIG. 9, the protrusion 217 of the bottom cover 210 and the groove 117 defined in the inner surface of the guide member 110 may have a predetermined distance d4 or d5 therebetween in a vertical or horizontal direction. Thus, the display panel assembly 10 may be shaken within the preset tolerance in the front/rear or left/right direction.

The vertical or horizontal distance d4 or d5 between the protrusion 217 of the bottom cover 210 and the groove 117 defined in the inner surface of the guide member 110 may be similar to that d1 between the guide member 110 and the middle frame 220. Thus, it may prevent the display panel assembly 10 from being shaken by a degree in which the guide member 110 collides with the middle frame 220.

Figure 10:
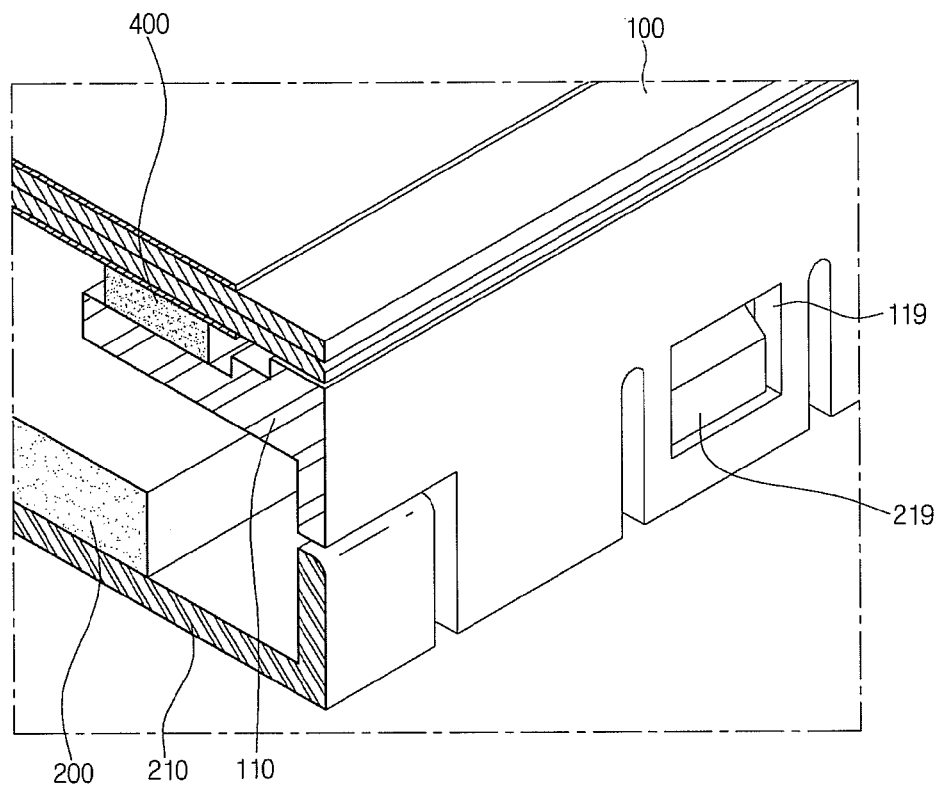
FIG. 10 is a partial perspective view of a display apparatus according to another embodiment.

FIG. 10 is a partial schematic perspective view of a display apparatus according to another embodiment.

The display apparatus according to the current embodiment is equal to the display apparatus according to the foregoing embodiment in that the display apparatus includes a backlight unit 200 and a bottom cover 210.

Also, the display apparatus according to the current embodiment is equal to the display apparatus according to the foregoing embodiment in that the display apparatus includes a display panel 100, a guide member 110, and a top case 120.

The guide member 110 according to the current embodiment may be bent in an 'L' shape. Thus, the guide member 110 may include a top surface part supporting the display panel 100 and a side surface part bent downward.

A buffer member 400 is coupled to an upper portion of the top surface part of the guide part 110. The guide member 110 extends along four edges of the display panel 100 having an approximately square plane. Thus, the buffer member 400 may have an approximately square shape along the outer edges of the display panel 100.

The buffer member 400 may be formed of a material which is capable of absorbing impacts, such as a sponge to absorb an impact applied into the display panel 100.

An adhesion member may be attached to each of both side surfaces of the buffer member 400, i.e., each of a side surface contacting the display panel 100 and a side surface contacting the guide member 110.

For example, a double-sided tape may be used as the adhesion member. In more detail, the double-sided tape may be attached to each of both upper and lower side surfaces of the buffer member 400. Thus, one side surface of the buffer member 400 may contact the display panel 100, and an opposite side surface of the buffer member 400 may contact the top surface part of the guide member 110.

Due to the above-described structure, light leakage of the display apparatus and introduction of foreign substances may be reduced. In addition, the display apparatus may be improved in durability.

A latch coupling part 119 may be disposed on the side surface part of the guide member 110. Also, a latch 219 couplable to the latch coupling part 119 may be disposed on the bottom cover 210.

Thus, when the guide member 110 is coupled to the bottom cover 210, the latch 219 may be elastically deformed and then elastically restored at a position corresponding to the latch coupling part 119. Thus, the latch 219 may be fitted into the latch coupling part 119 to couple the guide member 110 to the bottom cover 119.

The bottom cover 210 according to the current embodiment may be equal to the bottom cover according to the foregoing embodiment except that the latch 219 is disposed on a side surface of the bottom cover 210. Thus, duplicated descriptions with the bottom cover 210 will be omitted.

Figure 11:
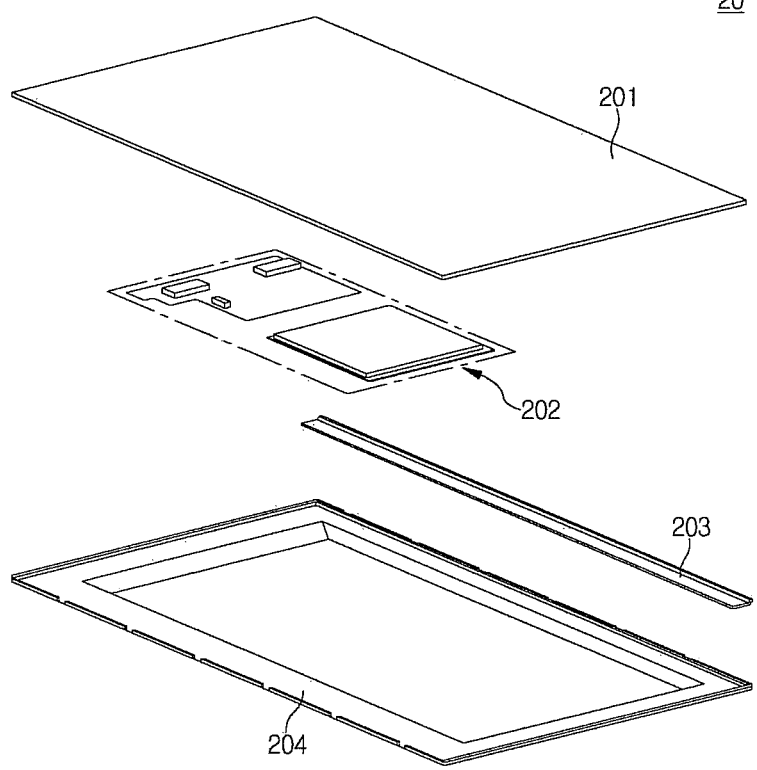
FIG. 11 is an exploded perspective view of a display apparatus according to another embodiment.

FIG. 11 is an exploded perspective view of a display apparatus according to another embodiment and illustrates an example of a backlight unit assembly 20. In configurations of the display apparatus of FIG. 11, descriptions with respect to configurations equal to those of FIGS. 1 to 10 will be omitted below.

Referring to FIG. 11, a backlight unit assembly 20 may include a plurality of layers 201 including a light guide plate and an optical sheet 201, a circuit board 202 disposed on a rear side of the plurality of layers 201, an LED assembly 230, and a back cover 204.

In this case, the bottom cover 210 described with reference to FIGS. 1 to 10 may be removed. Also, the LED assembly 230 may be coupled to an inner surface of a lower end of the back cover 204. Then, the circuit board 202 is coupled, and the light guide plate and the optical sheet 201 may be seated.

Thus, the display apparatus may be simply assembled and reduced in weight.

An LVDS cable and a speaker cable may be connected to the inside of the display apparatus through a stepped portion disposed on one area of the back cover 204. As shown in FIG. 11, since the inside of the backlight unit is hidden, heat generated from LEDs and circuit board may be conducted into the back cover 204. Therefore, the display apparatus having a ventless structure may be realized.

According to the embodiments, since the adhesion layer for fixing the display panel to the guide member is disposed on the non-contact area of the guide member for supporting the display panel, the light leakage of the display apparatus and the introduction of the foreign substances may be reduced. In addition, the process of manufacturing the display apparatus may be simplified.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. Therefore, contents with respect to various variations and modifications will be construed as being included in the scope of the present disclosure.

What is claimed is:

1. A display apparatus comprising:
    a display panel;
    a guide member supporting a peripheral area of a back surface of the display panel;
    an adhesion member fixing the guide member to the display panel; and
    a bottom cover supporting a lower portion of the guide member,
    wherein the bottom cover comprises a protrusion protruding laterally, and
    the protrusion of the bottom cover is inserted into a groove defined in an inner surface of the guide member.

2. The display apparatus according to claim 1, wherein the guide member comprises a contact part contacting the display panel and a non-contact part which does not contact the display panel, and
    the adhesion member is disposed on the non-contact part.

3. The display apparatus according to claim 2, wherein a top surface of the guide member is stepped,
    wherein a relatively protruding portion defines the contact part, and a relatively recessed portion defines the non-contact part.

4. The display apparatus according to claim 2, wherein the contact part is disposed outside the non-contact part on which the adhesion member is disposed.

5. The display apparatus according to claim 1, wherein a groove on which an upper end of the bottom cover is seated is defined in a bottom surface of the guide member.

6. The display apparatus according to claim 5, wherein the upper end of the bottom cover is bent in one direction so that the upper end of the bottom cover is seated on the groove defined in the guide member.

7. The display apparatus according to claim 5, wherein the groove defined in the guide member has a width greater than that of the upper end of the bottom cover.

8. The display apparatus according to claim 1, further comprising a middle frame disposed to laterally cover the display panel and the guide member, the middle frame defining an outer appearance of a side surface of the display apparatus.

9. The display apparatus according to claim 8, wherein a distance between the display panel and the middle frame is greater than that between the guide member and the middle frame.

10. The display apparatus according to claim 1, further comprising a top case disposed to contact an outer surface of the guide member.

11. The display apparatus according to claim 10, wherein a stepped area on which the tap case is disposed is disposed on the outer surface of the guide member.

12. The display apparatus according to claim 1, wherein the adhesion member is divided into a plurality of adhesion layers.

13. The display apparatus according to claim 1, further comprising a buffer member coupled between the guide member and the display panel.

14. The display apparatus according to claim 13, wherein the guide member comprises a top surface part supporting the display panel and a side surface part bent downward from the top surface part, and the buffer member is coupled to the top surface part.

15. The display apparatus according to claim 14, wherein a latch is disposed on the side surface part of the guide member, and
 a latch coupling part to which the latch is coupled is disposed on the bottom cover.

16. The display apparatus according to claim 13, wherein the buffer member comprises a double-sided tape coupled to upper and lower portions of the buffer member.

17. The display apparatus according to claim 13, wherein the buffer member comprises a sponge.

18. The display apparatus according to claim 13, wherein the display panel has a square shape, and
 the buffer member extends along four sides of the display panel.

19. A display apparatus comprising:
 a display panel;
 a guide member supporting a peripheral area of a back surface of the display panel;
 an adhesion member fixing the guide member to the display panel; and
 a bottom cover supporting a lower portion of the guide member,
 wherein a groove on which an upper end of the bottom cover is seated is defined in a bottom surface of the guide member, and
 wherein the groove defined in the guide member has a width greater than that of the upper end of the bottom cover.

* * * * *